(12) United States Patent
Kim

(10) Patent No.: US 6,297,090 B1
(45) Date of Patent: Oct. 2, 2001

(54) METHOD FOR FABRICATING A HIGH-DENSITY SEMICONDUCTOR MEMORY DEVICE

(75) Inventor: Ki-Nam Kim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/255,293

(22) Filed: Feb. 22, 1999

(30) Foreign Application Priority Data

Aug. 14, 1998 (KR) ................................................ 98-33151

(51) Int. Cl.⁷ ............................................... H01L 21/8242
(52) U.S. Cl. ...................... 438/253; 438/396; 438/459; 438/977
(58) Field of Search .................... 438/253, 396, 438/459, 977, FOR 485, FOR 107, FOR 212

(56) References Cited

U.S. PATENT DOCUMENTS

| 4,471,525 | * | 9/1984 | Sasaki . | |
|---|---|---|---|---|
| 5,102,819 | * | 4/1992 | Matsushita et al. . | |
| 5,631,186 | | 5/1997 | Park et al. ........................... | 155/438 |
| 5,858,858 | * | 1/1999 | Park et al. . | |
| 5,888,864 | * | 3/1999 | Koh et al. . | |
| 6,060,346 | * | 5/2000 | Roh et al. . | |
| 6,165,830 | * | 12/2000 | Lin et al. . | |

FOREIGN PATENT DOCUMENTS

| 023384 A1 | 2/1986 | (EP) . |
|---|---|---|
| 0315803 A2 | 5/1989 | (EP) . |
| 2318909 A | 5/1998 | (GB) . |

* cited by examiner

*Primary Examiner*—George Fourson
*Assistant Examiner*—Michelle Estrada
(74) *Attorney, Agent, or Firm*—Marger Johnson & McCollom, P.C.

(57) ABSTRACT

A method for fabricating a high-density semiconductor memory device which can reduce chip size and increase memory device characteristics. The present invention provides SOI type memory device. The capacitor is embedded in the insulator below the semiconductor wafer and the transistor is formed after the formation of the capacitor. As a result, the degradation of the transistor can be prevented, sufficiently increase the capacitor surface area, and provide fully planarized surface during the processing steps.

4 Claims, 15 Drawing Sheets

METHOD FOR FABRICATING A HIGH-DENSITY SEMICONDUCTOR MEMORY DEVICE

FIELD OF THE INVENTION

The present invention relates to methods for fabricating high-density semiconductor memory devices, and more particularly, to methods for fabricating high-density dynamic random access memories (DRAMs) utilizing an SOI (silicon on insulator) technique by bonding two bulk silicon wafers.

BACKGROUND OF THE INVENTION

Bit density of semiconductor memories increases four times per three years and operation speeds thereof also increase. Such development in semiconductor memories enables 1 GHz (giga hertz) operation speed for a 1 Gb (giga bit) DRAM (dynamic random access memory) device.

In DRAM devices, an $8F^2$ memory cell size adopted in a 64K DRAM density era has been employed up to now. The $8F^2$ memory cell is called as a folded bit line cell architecture in view of bit line arrangement with respect to a sense amplifier. The $8F^2$ is the smallest theoretical cell size of the folded bit line cell architecture. Herein, the F depicts a minimum feature size and is normally determined by a minimum design rule which can be patterned. The F may also mean half(½) of parallel bit line pitch comprising a memory cell array. For example, a smallest cell size of a 0.6 $\mu$m pitch becomes 8×0.3×0.3=0.72 $\mu m^2$.

FIG. 1A shows a layout of a memory cell having an $8F^2$ folded bit line cell architecture of a COB (capacitor over bit line) that is mainly used in the present high-density DRAM. FIG. 1B is a cross-sectional view taken along a line 1A–1A' of FIG. 1A.

Referring to FIG. 1A and FIG. 1B, a transistor 6 having a gate electrode (word line (WL)) and source and drain regions (not shown) is formed on a semiconductor substrate 1 where a device isolation layer 2 is formed. Contact pads are formed to be electrically connected to an active region 3 between the word lines. The contact pads include a storage electrode contact pad 8a and a bit line contact pad 8b. A storage electrode 16 and a bit line 11 are formed to be respectively connected with the storage electrode contact pad 8a and the bit line contact pad 8b through selected interlayer insulating films 10, 12. Herein, the bit line 11 is formed under the storage electrode 16, i.e., the bit line 11 is formed before the formation of the storage electrode 16.

In foregoing COB memory cell architectures, since a memory cell capacitor is formed after formation of the word line (WL) and bit line 11, a memory cell contact hole 14 has an inevitably high aspect ratio. In other words, the interlayer insulating film 12 is thick and it is difficult to open a contact hole therein. To solve the problem of etching the high aspect ratio contact hole 14, a process of forming a landing pad, so called cell pad, is generally used.

It is impossible, however, to form a silicide layer simultaneously on a top surface of a gate and a source/drain in the landing pad application. As a result, it becomes complex and difficult to implement a high performance logic device and DRAM device together. In addition, the misalignment of word line or bit line may cause shorts between a memory cell and a word line, or between a memory cell and a bit line, during the step of forming memory cell contact. These inherent problems stand in the way of reduction of DRAM cell density and implementation of a large capacity and high performance DRAM cell.

Once the minimum feature size (F) is decided, a minimum cell size is decided and an area occupied by an array according to DRAM density is calculated. The area occupied by array is given as 'Nbit×cell size'. In case of a 1 Gb DRAM, for example, the Nbit corresponds to $2^{30}$ (=1,073,741,824). The ratio of the array area with respect to a total chip size is called as 'array efficiency'. The array efficiency, in case of high-density DRAM devices, such as a 64 Mb DRAM and more, is about 65%. Accordingly, the chip size is expressed by a following equation as a function of minimum feature size (F).

$$S_C = \alpha^{-1} \times N_{bit} \times 8F^2$$

Herein, $S_C$ denotes a chip size and $\alpha$ denotes an array efficiency. The calculation of a DRAM chip size according to a minimum feature size or density in accordance with foregoing equation is shown in FIG. 2. Herein, the chip size is calculated in accordance with an $8F^2$ folded bit line cell architecture and array efficiency of 65% in every memory device density era.

In FIG. 2, it is expected that a 1 Gb chip size will be about 425 $mm^2$, 4 Gb about 960 $mm^2$, and 16 Gb about 2000 $mm^2$. It is expected to be very difficult to obtain a good chip yield from such a large chip size and it is well known that the yield is in inverse proportion to a chip size. For a cost-effective high-density DRAM, therefore, it is a necessary that a memory cell size be made from the same minimum feature size. It is well known in the art that the minimum cell size of an open line cell architecture is $6F^2$ (remember that $8F^2$ is the minimum cell size of the folded bit line cell structure). The open bit line cell architecture is disadvantageous, however, because of its inferior noise immunity and because of difficulty in the sense amplifier layout.

A combined approach of open bit line layout and folded bit line sensing has also been recently reported. This approach is also disadvantageous, however, as it requires an additional mask.

SUMMARY OF THE INVENTION

The present invention was made in view of the above problem, and it is therefore an object of the invention to provide a high-density semiconductor memory device and a method thereof which can reduce a device isolation region, provide larger active region and thus advantageously reduce device dimension. The present invention utilizes bonded wafer, i.e., SOI substrate where memory device is built. The memory device is so fabricated on the bonded wafer that the areas required to isolate between well-to-well can be reduced, the size of the isolation space can also be reduced and thereby reducing chip size.

To achieve this and other advantages and in accordance with the purpose of the present invention, there are provided two wafers, i.e., process wafer and handle wafer. First, a trench etching mask is formed over the process wafer to define an active region and an inactive region. The exposed process wafer is then etched to form a trench. An insulating material is deposited in the trench and over the trench etching mask. Planarization process is carried out down to a top surface of the trench etching mask and thereby forming trench isolation. The trench isolation surrounds the active region to electrically isolate each active region. Selected portions of the trench etching mask is etched down to the active region of the process wafer to form a contact hole for a capacitor lower electrode. A conductive material is deposited in the contact hole and over the trench etching mask and the trench isolation and then patterned to form a lower electrode. A dielectric film and an upper electrode are deposited to form a capacitor. The upper electrode is planarized. The planarized upper electrode of the process wafer and the handle wafer are bonded together disposing a bonding insulating layer therebetween. The surface of the process wafer of the bonded wafer is planarized down to a top surface of the trench isolation. A transistor is formed over the planarized surface of the process wafer of the banded wafer. The transistor includes a gate electrode and a junction region. An interlayer insulating layer is formed over the transistor to cover thereof The selected interlayer insulating layer is etched to form a bit line contact hole exposing the junction region. A conductive material is deposited in the bit line contact hole and over the interlayer insulating layer and patterned to form a bit line.

In aspect of the present invention, since the formation of the capacitor is followed by the formation of the transistor, the degradation of the transistor can be suppressed. The trench etching mask is not removed. Instead, the trench etching mask serves to surround the active region together with the trench isolation and thus the process can be simplified and the degradation of the trench isolation characteristics can be prevented.

In another aspect of the present invention, the minimum space between the active region and an adjacent active region is smaller than the minimum width of the active region. The space between the bit line and an adjacent bit line is smaller than a width of the bit line and the space between the gate electrodes.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Figure 1A:
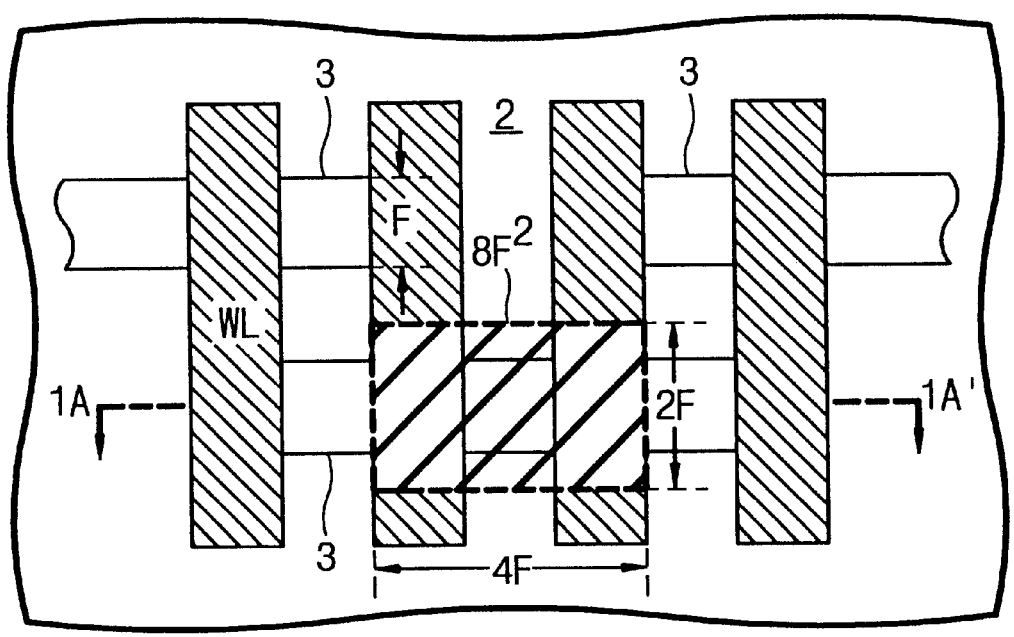
FIG. 1A shows schematically a memory cell layout diagram having a folded bit line cell architecture.
Figure 1B:
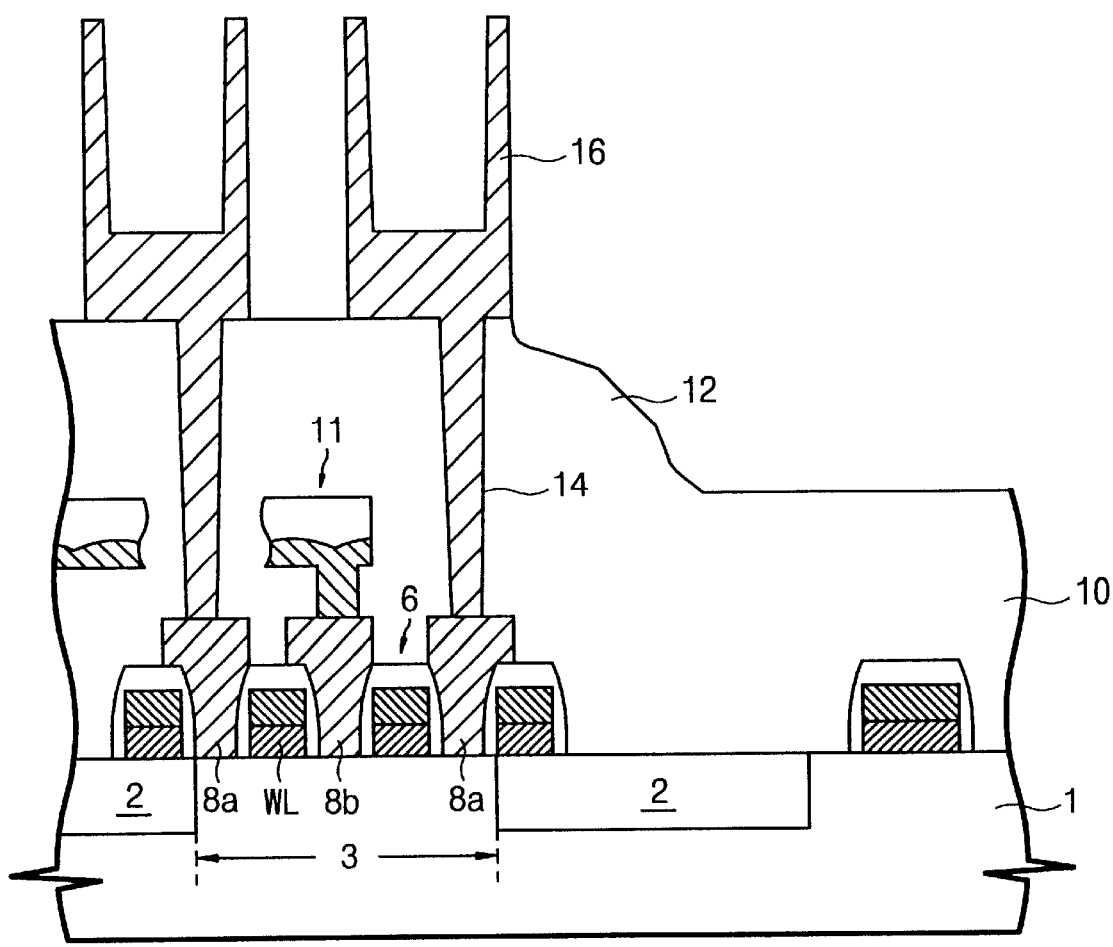
FIG. 1B shows a cross-sectional view of a COB stacked cell architecture, taken along line 1A–1A' of FIG. 1A.
Figure 2:
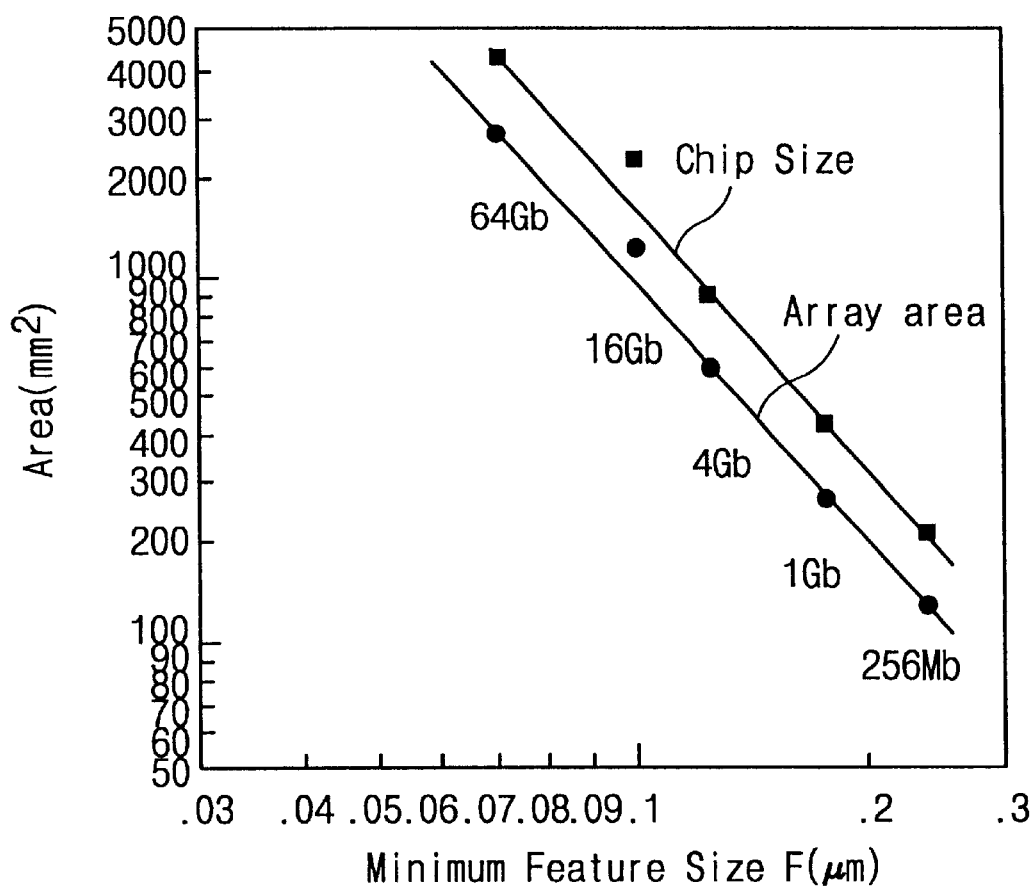
FIG. 2 illustrates an array size and a chip size as a function of minimum feature size and cell area.
Figure 3:
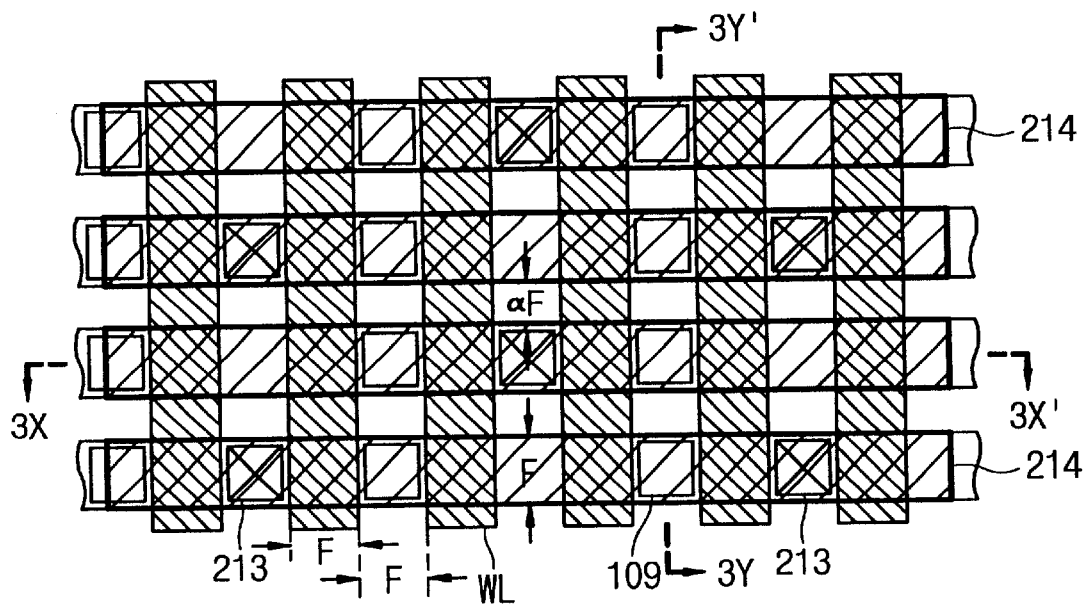
FIG. 3 shows schematically a memory cell layout diagram according to an embodiment of the present invention.

The preferred embodiment of the present invention will now be described with reference to the accompanying drawings. The present invention relates to a method for fabricating a high-density memory device using a bonded wafer, i.e., SOI substrate. In accordance with the present invention, the high-density memory device is fabricated with a folded bit line cell architecture having a design rule of less than $8F^2$ cell size. FIG. 3 shows schematically a memory cell layout diagram according to an embodiment of the present invention and FIGS. 4A and 4B show cross-sectional views taken along line 3X–3X' and 3Y–3Y' of FIG. 3, respectively.

Figure 4A:
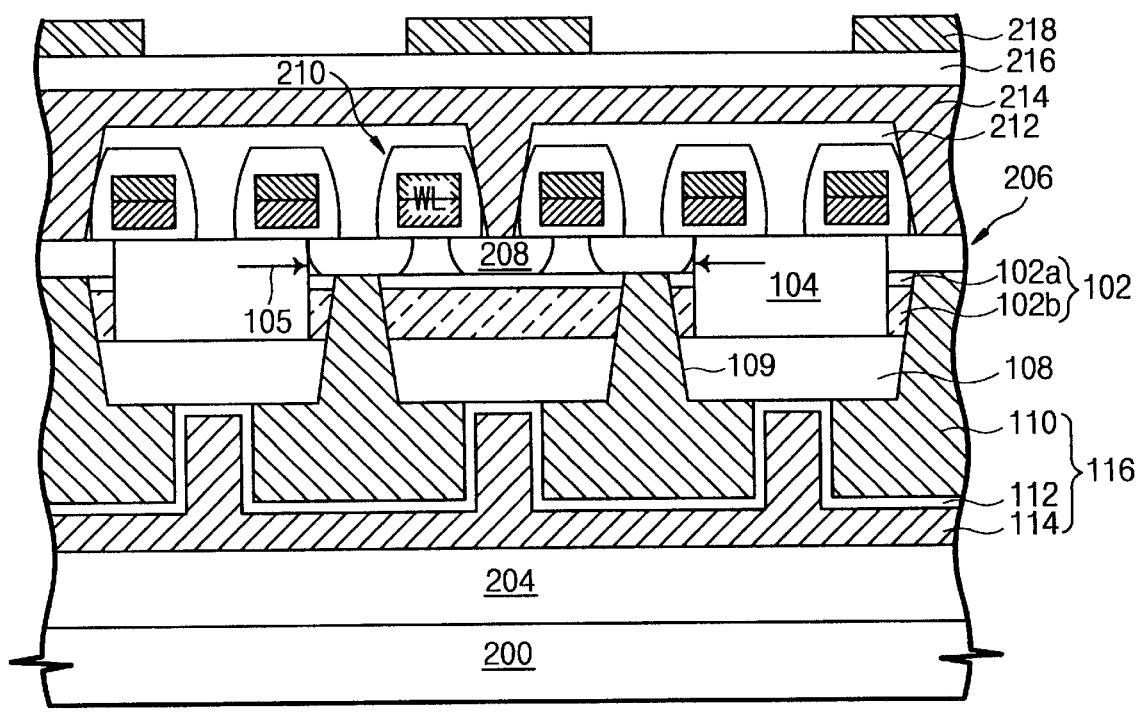
FIG. 4A shows a cross-sectional view taken along line 3X–3X' of FIG. 3.

Referring to FIG. 3 and FIG. 4A, an active region 105 whereon a cell transistor and storage node and bit line contacts are formed is entirely surrounded by an insulating material except a top surface thereof. More specifically, the active region 105 is surrounded by a device isolation layer 104 (herein trench isolation) and a trench etching mask 102. Furthermore, the active region 105 is electrically separated from peripheral cell and bulk silicon. The insulating material surrounding the active region includes a silicon oxide layer, a doped silicon oxide layer, such as borophosphosilicate glass, and a silicon nitride layer.

As it is well known, the breakdown voltage of the silicon oxide layer is greater than that of the bulk silicon by about one order of magnitude. Therefore, complete isolation by oxide encapsulation can greatly save the area necessary for well-to-well junction isolation in bulk silicon and can completely eliminate the latch-up which is sometimes a great concern in bulk transistor. The minimum isolation space between adjacent active regions can be easily scaled down from one 'F' which is required in conventional bulk silicon to '$\alpha F$' where $\alpha$ is above zero and less than 1.

Figure 4B:
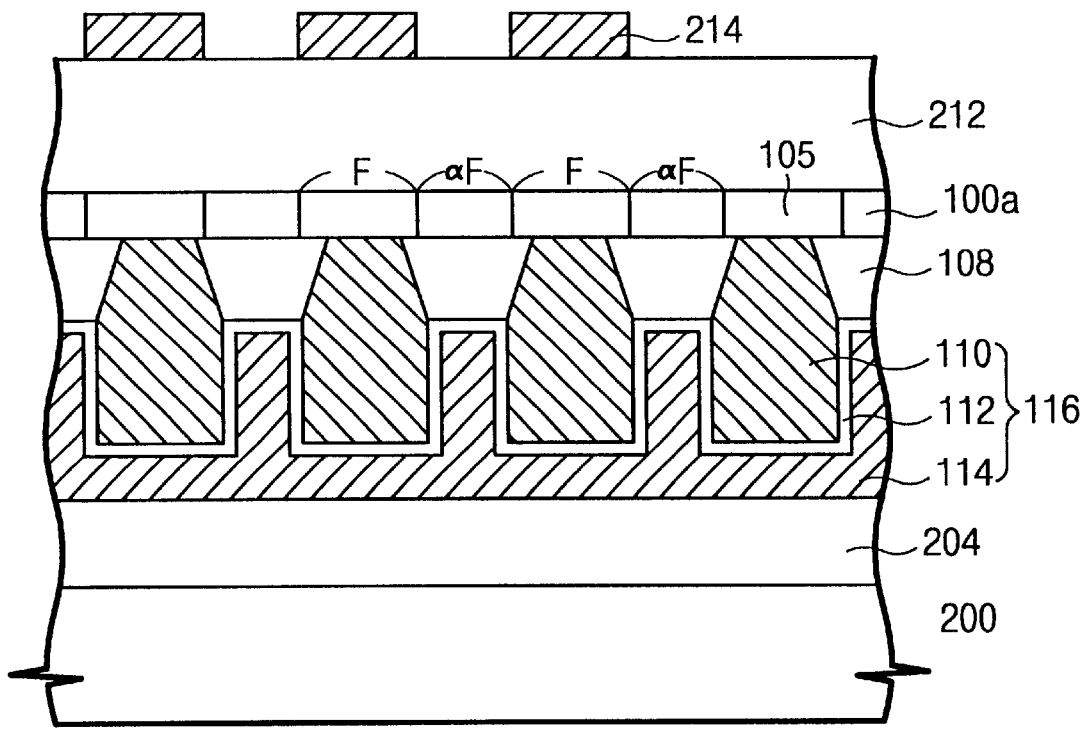
FIG. 4B shows a cross-sectional view taken along line 3Y–3Y' of FIG. 3.
Figure 5:
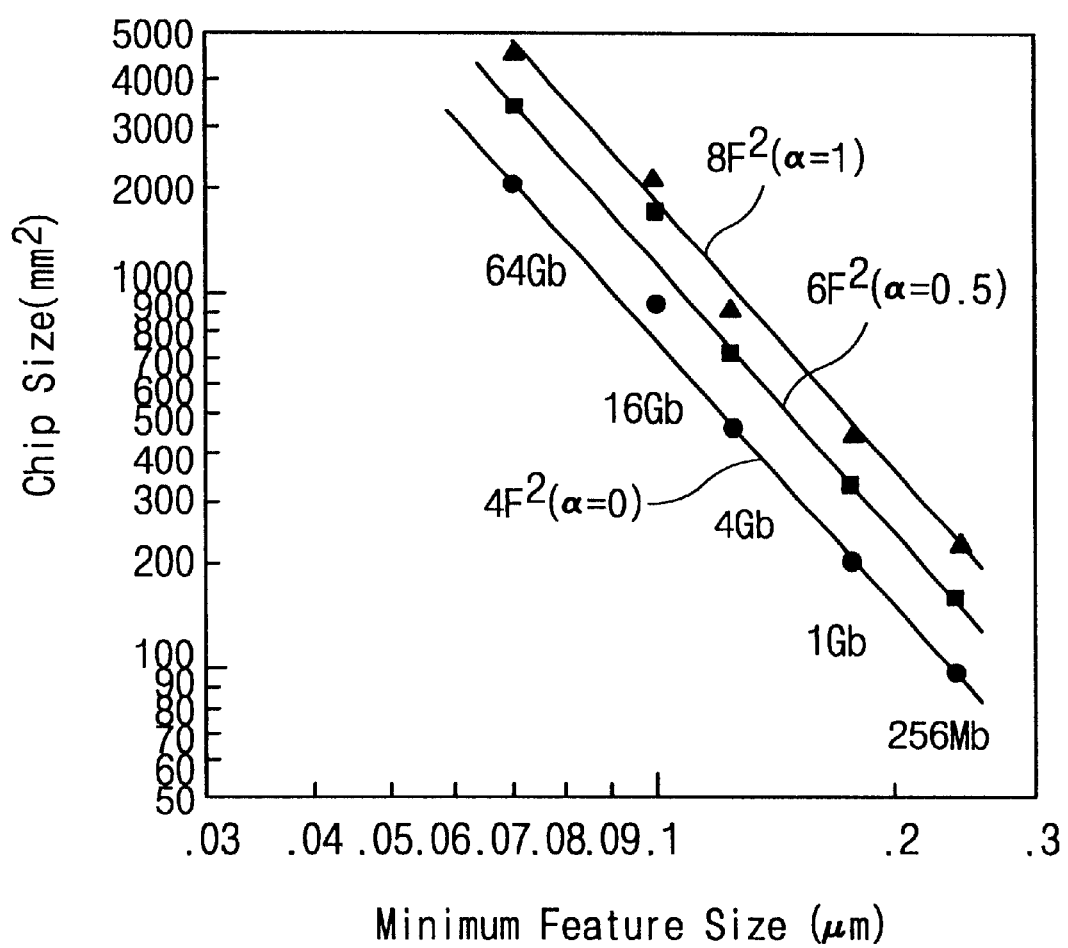
FIG. 5 illustrates the relationship between chip size and minimum feature size.

As can be seen in FIG. 3 and FIG. 4B, the minimum feature size along the bit line direction is 'F' but the minimum feature size along the word line is '$\alpha F$'. Herein, the '$\alpha F$' corresponds to isolation space dimension. As described above, the reduction of the isolation space dimension can be done by oxide encapsulation. The breakdown voltage of the silicon oxide layer is greater than that of the bulk silicon by about one order of magnitude. Therefore, a trench isolation structure can be obtained by oxide encapsulation by a magnitude of about one tenth trench isolation dimension as compared to bulk silicon. Therefore, the cell size of less than $8F^2$, i.e., about $4(1+\alpha)F^2$ can be obtained from same minimum feature size (F). The estimation of chip size versus density according to minimum feature size is illustrated in FIG. 5 according to a magnitude of 1, 0.5, and 0, respectively. As can be seen in FIG. 5, if $\alpha$ is 1, it corresponds to the minimum cell size of the conventional folded bit line cell architecture. If $\alpha$ is 0.5, it corresponds to about three quarters of the minimum cell size of the folded bit line cell architecture. In this case, the chip size reduces proportionally to $\alpha$. If $\alpha$ is zero, it corresponds to a half of the minimum cell size of folded bit line cell architecture—cell sizes less than this are considered to be impossible.

Referring again to FIG. 3, FIG. 4A and FIG. 4B, a memory cell capacitor 116 is buried on an insulator below a thin silicon wafer, i.e., formed below a thin semiconductor substrate 100a (process wafer) and device isolation region 104. The memory cell capacitor 116 each includes a storage node 110, a dielectric film 112 and a plate electrode 114. The storage node is electrically connected to source/drain region 208 of the transistor 210 through a contact hole 109 in the interlayer insulating layer 108 and the trench etching mask 102. Since the memory cell capacitor 116 is buried in the insulator below the active device, height differences (steps) between the cell array region and the peripheral region are not generated. The process steps following the step of transistor formation are the same as the conventional CMOS process steps. Therefore, it can be applied to logic CMOS process or embedded logic process wherein DRAM and logic are merged.

Process wafer 100a and a handle wafer 200 are bonded together with a bonding oxide layer 204 disposed therebetween. A bit line 214 is formed over the process wafer 100a and electrically connected to source/drain region 208 through selected interlayer insulating layer 212. Another interlayer insulating layer 216 is formed over the bit line 214 and a metal line 218 is formed over the interlayer insulating layer 216.

The fabrication process for above mentioned cell architecture will now be described with reference to FIG. 6 and FIG. 7. FIGS. 6A to 6F show, at selected stages of fabrication, the cross-sections of memory device formed on a process wafer in accordance with an embodiment of the present invention and FIGS. 7A to 7C show cross-sectional views taken along line 6A–6A', 6B–6B', and 6C–6C' of FIGS. 6A to 6C, respectively.

Figure 6A:
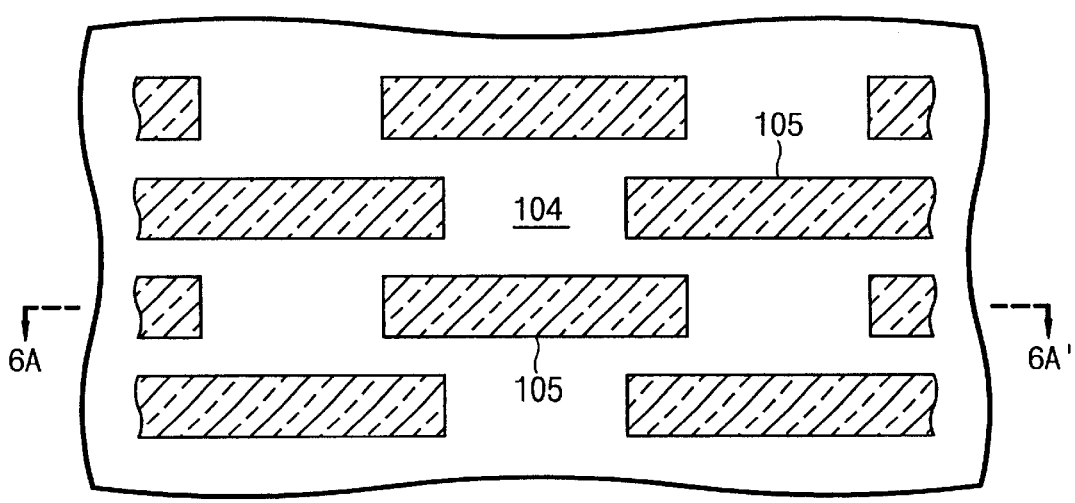
FIGS. 6A to 6F show, at selected stages of fabrication, the cross-sections of memory device formed on a process wafer in accordance with an embodiment of the present invention.
Figure 7A:
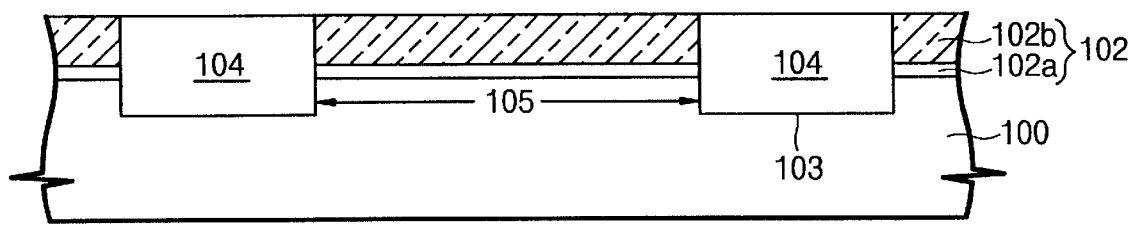
FIGS. 7A to 7C show cross-sectional views taken along line 6A–6A', 6B–6B', and 6C–6C' of FIGS. 6A to 6C, respectively.

Referring to FIG. 6A and FIG. 7A, a trench etching mask 102 is formed over a semiconductor substrate 100 (process wafer) to define an active region 105 and an inactive region. The trench etching mask 102 is made of an insulating material, for example, a multilayer of an oxide layer 102a and a silicon nitride layer 102b. The exposed semiconductor substrate 100 by the trench etching mask 102 is etched to form a trench 103. trench isolation layer is deposited in the trench 103 and over the trench etching mask 102. Planarization process such as CMP (chemical mechanical polishing) is carried out down to a top surface of the trench etching mask 102 to form a device isolation layer 104, i.e., shallow trench isolation (hereinafter referred to STI). Herein, the minimum space dimension ('αF') between adjacent active regions is smaller than the minimum width dimension ('F') active region. The depth of the trench in accordance with the present invention is determined according to the thickness of the silicon layer whereon active devices are formed. On the other hand, in case of conventional STI technique in bulk silicon, the depth of the trench is determined according to the isolation punch through. Therefore, the process of STI can be simplier than a bulk silicon process.

Figure 6B:
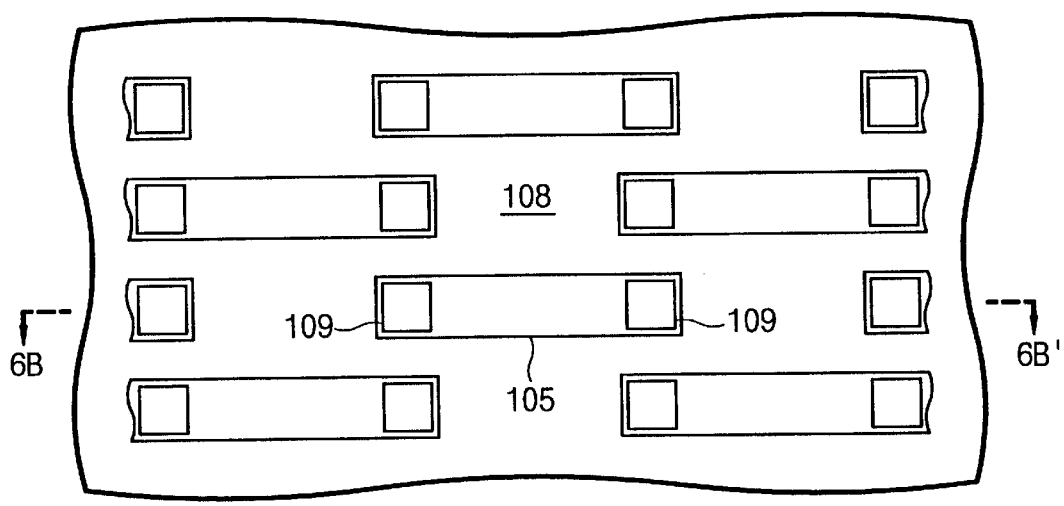
Figure 7B:
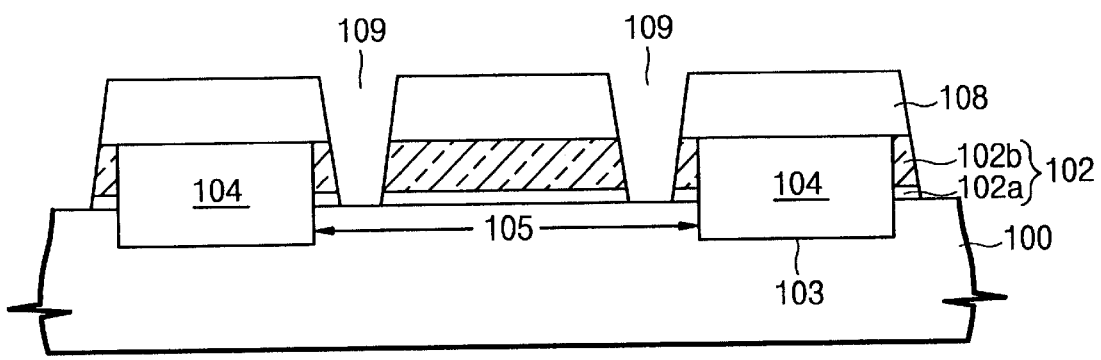
Figure 7C:
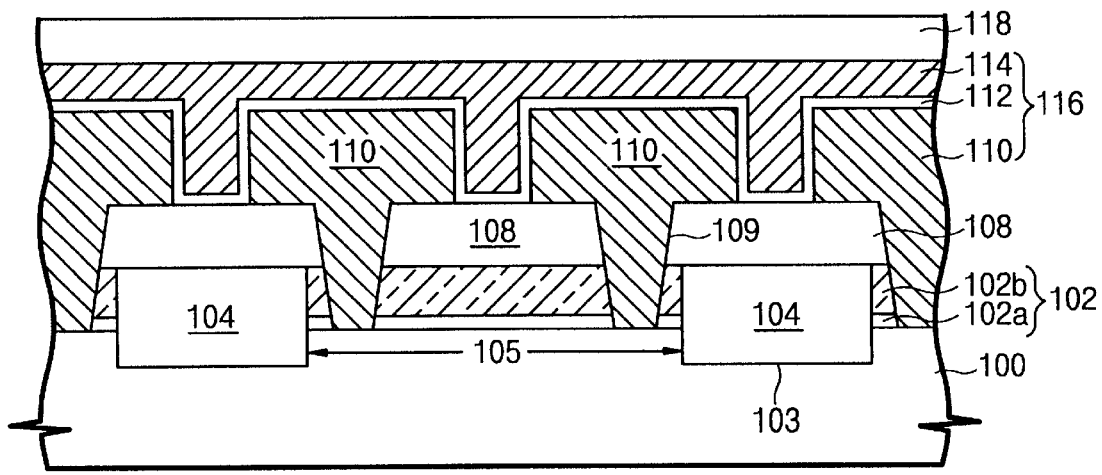

Referring to FIG. 6B and FIG. 7B, an interlayer insulating layer 108 is deposited over the trench isolation 104 and trench etching mask 102. Selected portions of the interlayer insulating layer 108 and trench etching mask 102 are etched to form a storage node contact hole 109 which reaches to the active region 105 of the semiconductor substrate 100. As is understood from above processing step, unlike the conventional STI technique, the trench etching mask 102 is not removed and thus a variety of problems occurred in the step of removing the trench etching mask can be inherently avoided.

Alternatively, the interlayer insulating layer 108 may not be formed, i.e., the contact hole 109 can be formed in the trench etching mask 102. Since the contact hole 109 is formed before the formation of the word line and bit line, the thickness of an insulating layer (herein trench etching mask and interlayer insulating layer) to be etched can be reduced. The contact hole 109 has a small aspect ratio, resulting in reduction of parasitic resistance and in ease of fabrication. The typical COB stacked capacitor has an aspect ratio of more than six times for the storage node contact in comparison with that of the present invention.

Figure 6C:
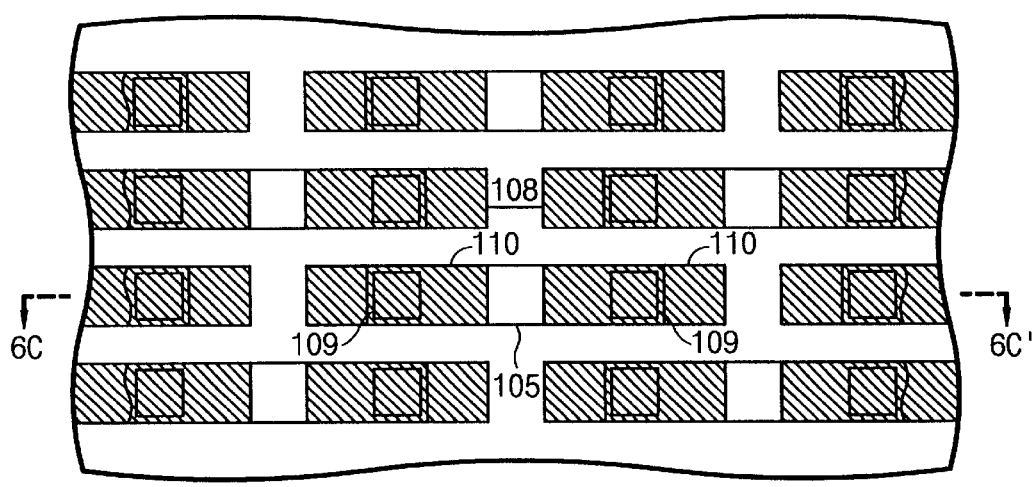

The formation of the capacitor 116 is next addressed. Referring to FIG. 6C and FIG. 7C, a conductive material for storage node is deposited over the resulting structure to a predetermined thickness and patterned to form a storage node 110. A dielectric film 112 is deposited over the storage node 110. A conductive material for a plate electrode 114 is deposited over the dielectric film 112. The top surface of the plate electrode layer is planarized.

The storage node 110 is made of doped polysilicon or metal having a larger work function. The dielectric film 112 is made of NO layer, $Ta_2O_5$ layer, $Al_2O_3$ layer, or BST. The plate electrode 114 is made of doped polysilicon, CVD TiN layer, or metal having a larger work function. An oxide layer 118 is deposited over the planarized top electrode 114.

Figure 7F:
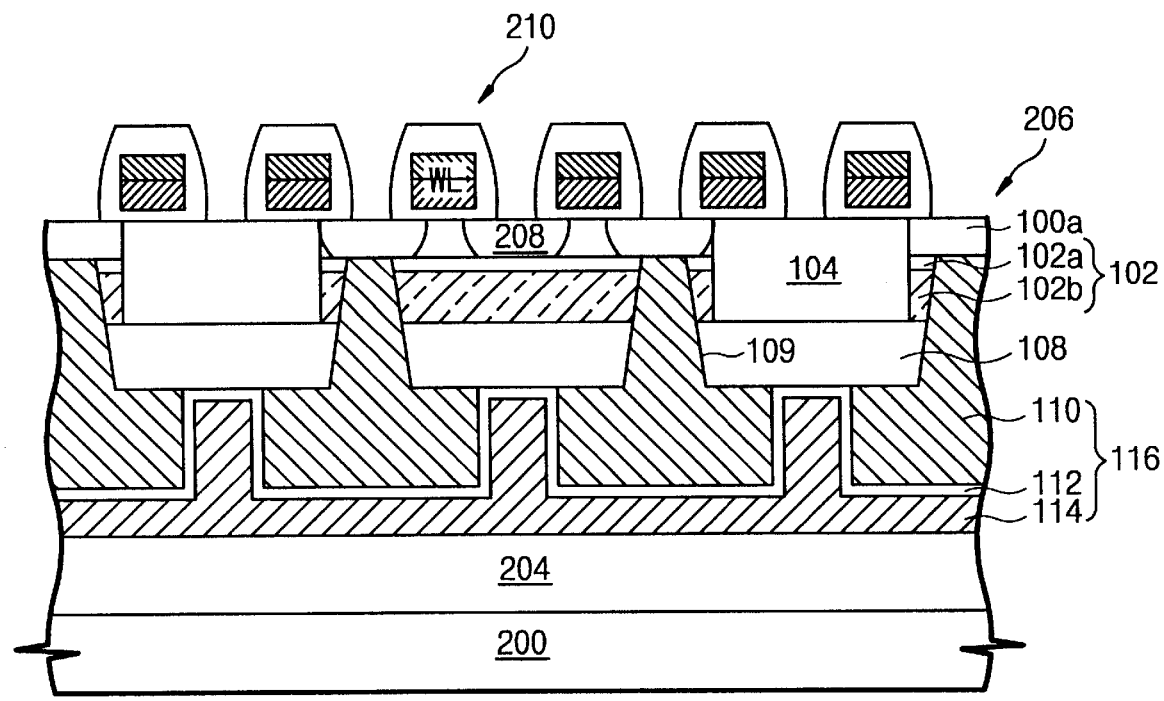
FIGS. 7F to 7H show cross-sectional views taken along line 6D–6D', 6E–6E', and 6F–6F' of FIGS. 6D to 6F, respectively.
Figure 7G:
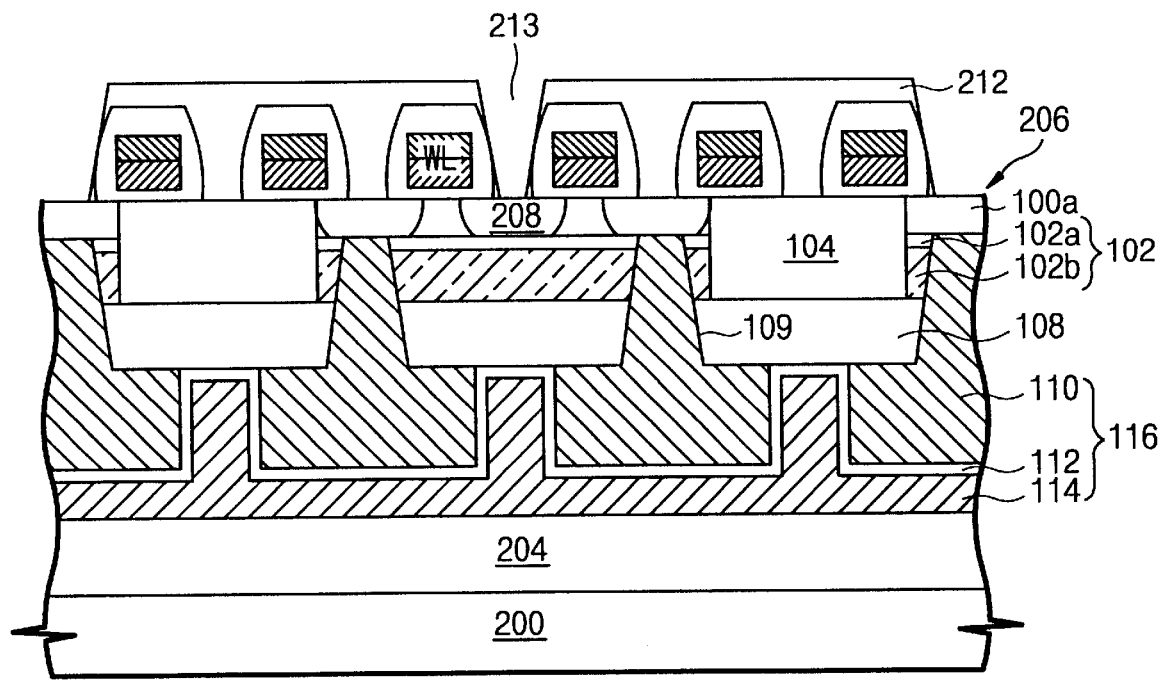
Figure 7H:
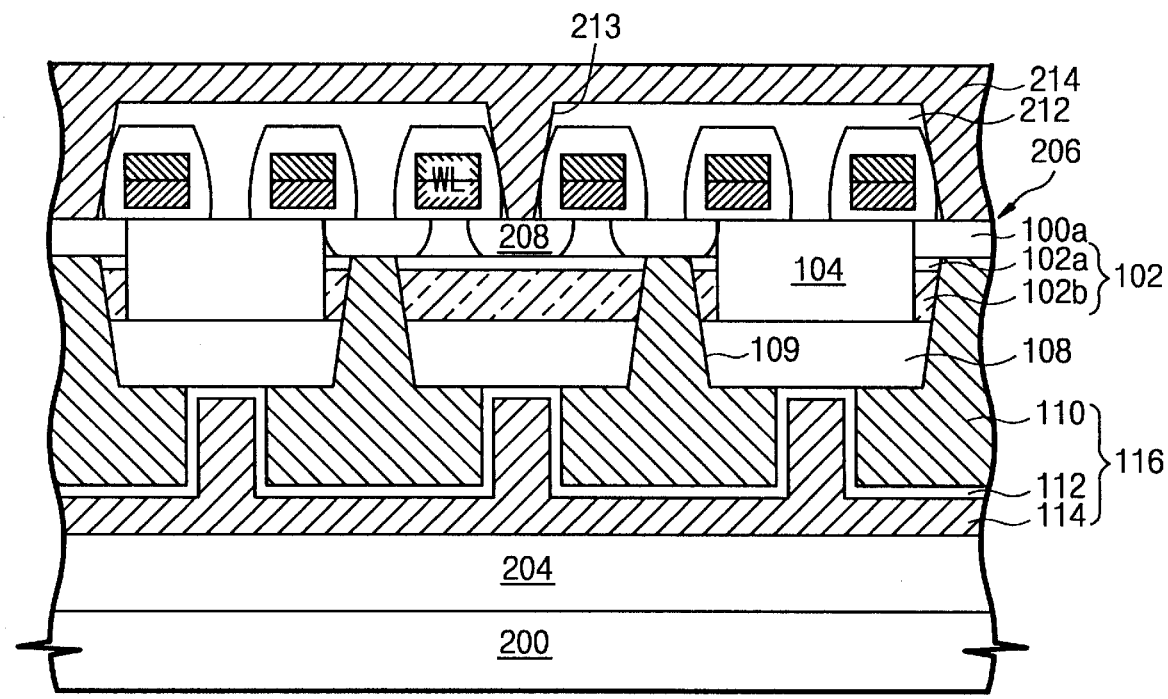
Figure 7D:
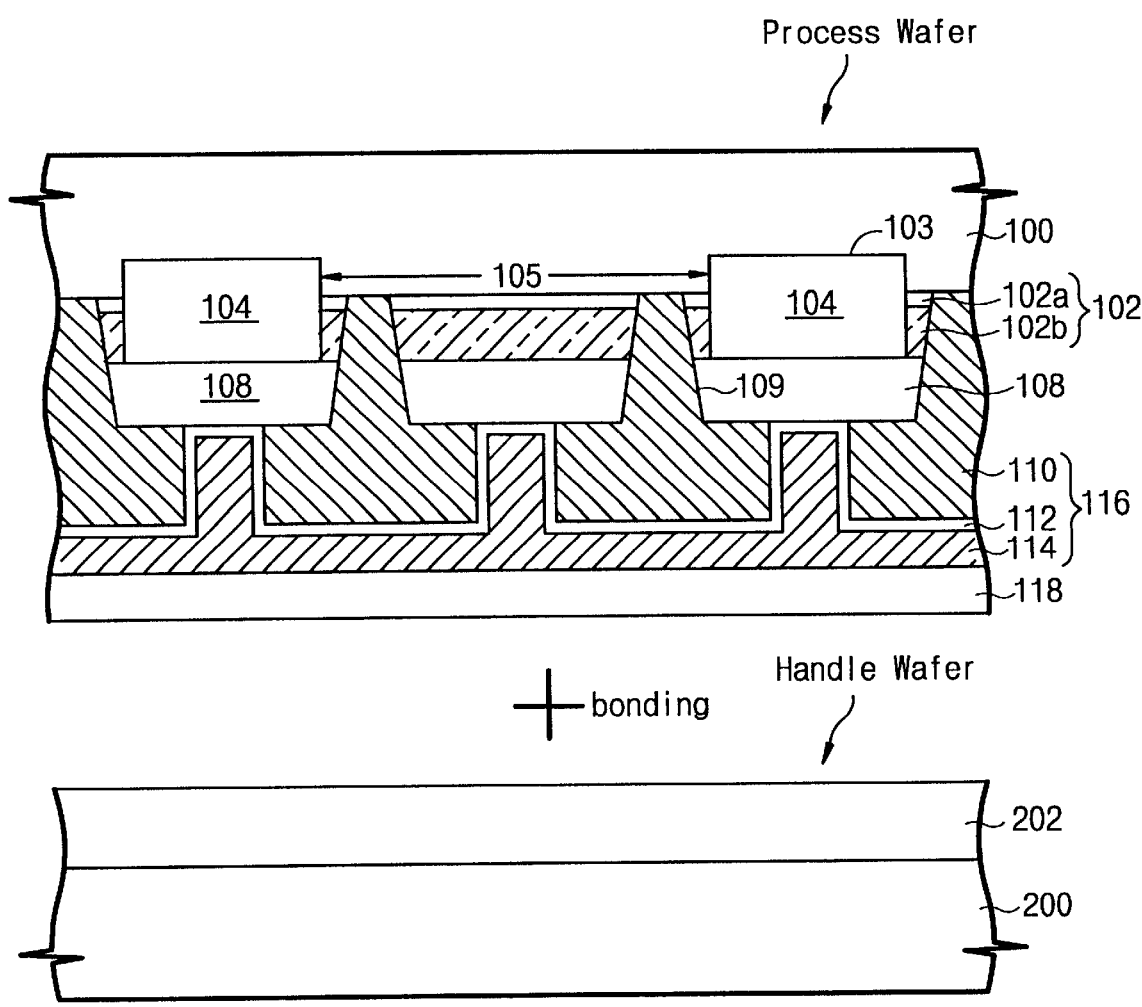
FIG. 7D shows a cross-sectional view of a process wafer and a handle wafer which are bonded together to form a bonded wafer.
Figure 7E:
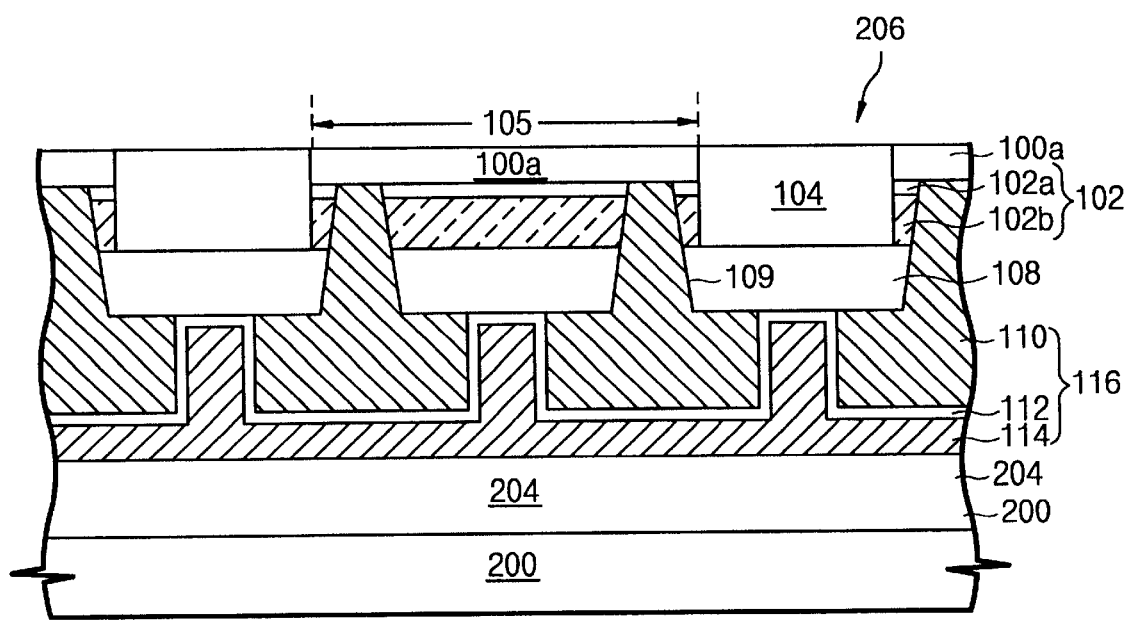
FIG. 7E shows a cross-sectional view of a bonded wafer after planarization process is carried out on a surface of a process wafer of the bonded wafer.

The next process is the formation of the SOI (silicon on insulator) substrate 206 and is schematically shown in FIG. 7D and FIG. 7E. The formation of SOI substrate 206 is carried out by a bonding technique. The oxide layer 118-covered process wafer 100 is bonded upside down with the oxide layer 202-covered handle wafer 200 at high vacuum and high temperature(about 650° C. to 750° C.).

In a conventional CMOS process, requirement of well-to-well isolation could increase a chip size. On the other hand, in an SOI process, smaller area is required for well-to-well isolation as compared to the conventional CMOS process and thus the chip size can be reduced. Latch-up problems encountered in the bulk silicon can be inherently avoided. In addition, shallow junctions can be easily formed and reliable soft-error immunity characteristics can be obtained.

Referring to FIG. 7E, the bared top surface of the process wafer 100 of the bonded wafer is planarized down to the top surface of the STI 104. The planarization can be performed by a CMP process and the STI serves as a stopper layer during the planarization process. The desired thickness of the process wafer is safely adjusted. The thickness of the process wafer is determined according to the depth of STI 104.

Figure 6D:
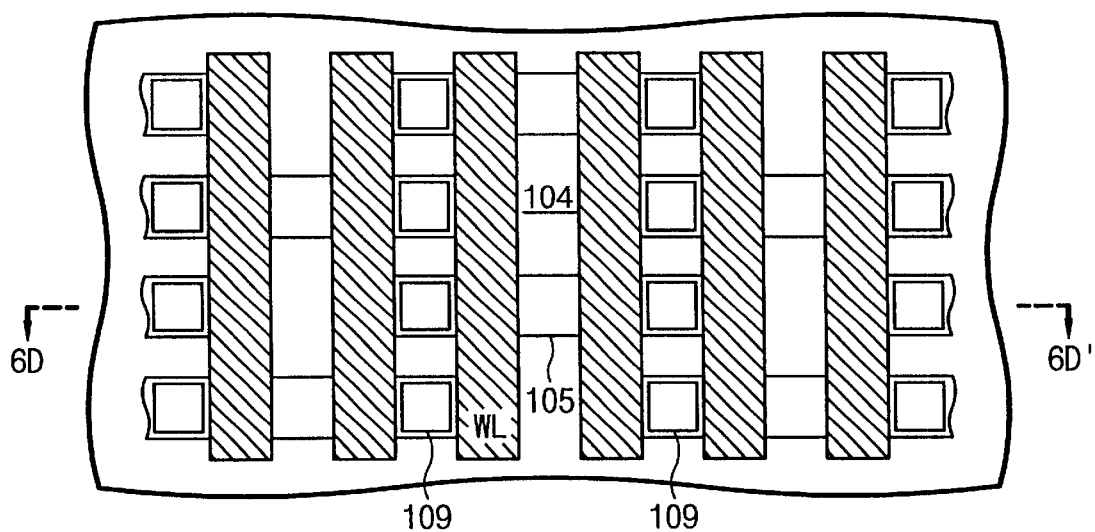

Referring to FIG. 6D and FIG. 7F, a thin gate oxide layer is grown on the planarized surface of the bonded wafer. A gate electrode layer is deposited on the gate oxide layer and patterned into a predetermined configuration, i.e., gate electrode line (word line). As is conventional in the art, the gate electrode is capped with a gate mask and a gate spacer. For LDD (lightly doped drain), low concentration ion implantation is carried out before the formation of the gate spacer. High concentration ion implantation is carried out after the formation of the gate spacer and completes LDD source/drain region 208, thereby forming transistor 210.

Since the transistor 210 is formed on the SOI substrate, problems of junction capacitance or junction leakage current can be avoided. Therefore, bit line parasitic capacitance can be reduced, sensing signal margin can increase and date retention time can increase.

High performance transistor can be more easily achieved because transistors are formed after the cell capacitor formation. Low resistance metal word line and bit lines can also be easily used because of low thermal budget. Furthermore, the transistors are formed on the fully planarized surface. Therefore, high performance logic process with multiple level metallization can be easily adopted.

A salicide layer may be formed on the source/drain region and on the top surface of the transistor for lower contact resistance.

Figure 6E:
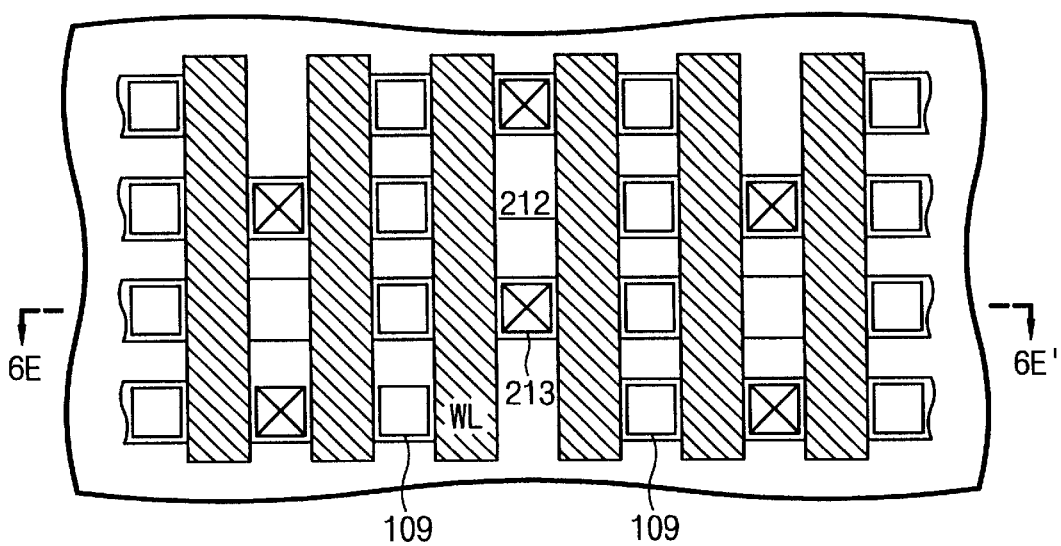
Figure 6F:
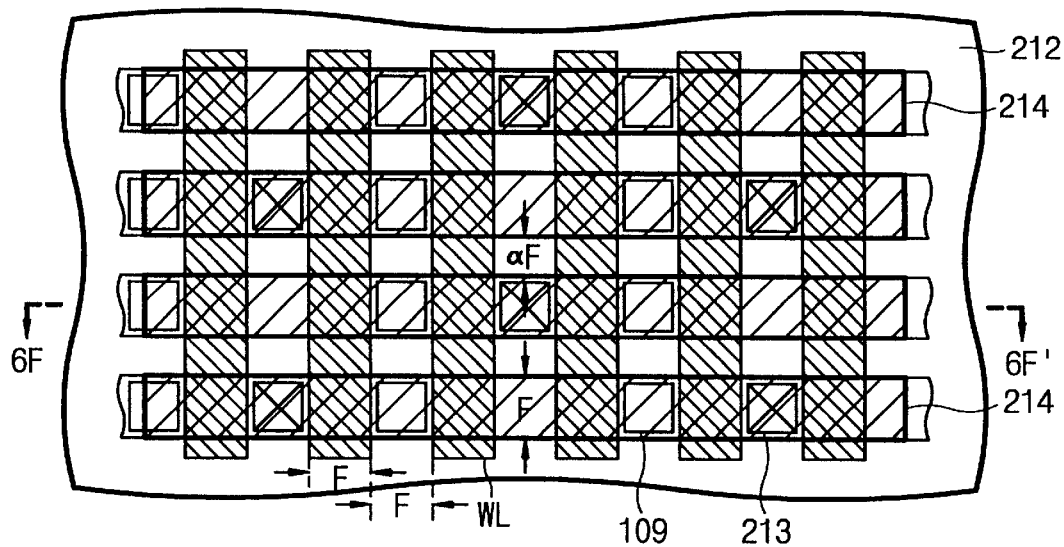

After formation of the transistor 210, an interlayer insulating layer 212 is deposited to a thickness sufficient to cover the transistor 210. Using photolithography, selected interlayer insulating layer 212 is etched to form a bit line contact 213 to the source/drain region, as shown in FIG. 6E and FIG. 7G. A conductive material is deposited in the contact hole 213 and over the interlayer insulating layer 212. The conductive material is then patterned to form a bit line 214, as shown in FIG. 6F and FIG. 7H. The conductive material may be made of tungsten. Herein, the space dimension ('αF') between adjacent bit lines is smaller than bit line width ('F') and the space dimension ('F') between adjacent word line.

The simultaneous formation of the $n^+$ contact and $p^+$ contact in the peripheral region is difficult to achieve in convention bit line process. It is possible, however, in the present invention. In a conventional COB structure, the formation of the cell capacitor after the formation of the bit line causes difference in diffusion rate between n-type and p-type impurities during thermal capacitor formation processes. This difference in diffusion rate results in variation of the contact resistance. On the other hand, like in CUB (capacitor under bit line), the bit line is formed after the formation of the capacitor. Therefore, the aforementioned problem can inherently be prevented. It is possible to form the $n^+$ contact and $p^+$ contact simultaneously, in the present invention, which makes the fabrication process less costly. The present invention has advantages of both the COB and CUB structures. Subsequently, a metallization process is carried out to form metal line 218, as shown in FIG. 4A.

The above-mentioned method can be applied not only to standard DRAM device with high-density and high performance but also to embedded DRAM device including high performance logic process.

As is understood from the explanation, the present invention provides SOI memory device which can reduce areas required to isolate well-to-well and to reduce isolation areas thereby to reduce chip size. In accordance with the present invention, the transistor is formed after the formation of the capacitor and thus degradation of the transistor characteristics can be suppressed. The trench etching mask surrounds the active region together with the trench isolation, resulting in easier fabrication process and avoiding the problem encountered in the step of removing the trench etching mask. Sufficient capacitor area can be obtained as a COB structure due to embedded capacitor in the insulator below substrate and planarization process can be easily done as in CUB structure.

What is claimed is:

1. A method for fabricating a high-density semiconductor memory device, comprising:

forming a trench etching mask on a first side of a semiconductor substrate to define an active region thereon, thereby exposing a region of the first semiconductor substrate, said trench etching mask being made of an insulator material;

etching said exposed region of the first semiconductor substrate, thereby forming a trench therein;

filling up said trench with an insulating material, thereby forming an isolation trench;

planarizing the resulting structure;

etching a portion of said trench etching mask, thereby forming a contact hole in said trench etching mask;

depositing a first conductive layer filling said contact hole and patterning said first conductive layer to form a capacitor lower electrode, said capacitor lower electrode being electrically connected to said first semiconductor substrate;

sequentially forming a dielectric film and a capacitor upper electrode layer overlying said capacitor lower electrode, said capacitor upper electrode layer having a planar top surface;

bonding said planar top surface of said capacitor upper electrode layer and a second semiconductor substrate with a bonding insulating layer disposed therebetween;

planarizing a second side of said first semiconductor substrate until said isolation trench is exposed;

forming a transistor at said planarized surface of said first semiconductor substrate, said transistor having a gate electrode and a junction region;

forming an interlayer insulating layer overlying said transistor;

forming a bit line contact hole in said interlayer insulating layer; and depositing a second conductive layer filling said bit line contact hole and patterning the second conductive layer to form a bit line.

2. The method according to claim 1, wherein the minimum space between adjacent active regions is smaller than the minimum width of said active region.

3. The method according to claim 1, wherein the space between adjacent bit lines is smaller than both the bit line width and the space between adjacent gate electrodes.

4. The method according to claim 1, further comprising, before said step of forming said contact hole in said etching mask, a step of forming an interlayer insulating layer overlying said trench etching mask.

* * * * *

UNITED STATES PATENT AND TRADEMARK OFFICE
CERTIFICATE OF CORRECTION

| | | |
|---|---|---|
| PATENT NO. | : 6,297,090 B1 | Page 1 of 1 |
| DATED | : October 2, 2001 | |
| INVENTOR(S) | : Kim | |

It is certified that error appears in the above-identified patent and that said Letters Patent is hereby corrected as shown below:

<u>Title page,</u>
Item [57], ABSTRACT,
Line 2, "which can reduce" should read -- that reduces --.
Line 2, "and increase memory" should read -- and improves memory --.
Line 3, "provides SOI" should read -- provides an SOI --.
Line 4, "The capacitor" should read -- A capacitor --.
Line 5, "in the insulator below" should read -- in an insulator layer below --.
Lines 5-6, "the transistor" should read -- a transistor --.
Line 7, "result, the degradation" should read -- result, degradation --.
Line 7, "prevented," should read -- prevented. --.
Line 8, "sufficiently increase the capacitor" should read -- The capacitor --.
Lines 8-9, "area, and provide" should read -- area is sufficiently increased, and a --.
Line 9, "surface during" should read -- surface is provided during --.

<u>Column 3,</u>
Line 11, "thereof the" should read -- thereof. The --.

<u>Column 5,</u>
Line 29, "trench 103. Trench" should read -- trench 103. A trench --.

Signed and Sealed this

Seventeenth Day of September, 2002

*Attest:*

*Attesting Officer*

JAMES E. ROGAN
*Director of the United States Patent and Trademark Office*